United States Patent [19]

Akashi et al.

[11] Patent Number: 5,551,978
[45] Date of Patent: Sep. 3, 1996

[54] APPARATUS FOR PRODUCING SINGLE CRYSTAL

[75] Inventors: Yoshihiro Akashi; Kaoru Takiuchi; Setsuo Okamoto, all of Amagasaki, Japan

[73] Assignee: Sumitomo Sitix Corporation, Amagasaki, Japan

[21] Appl. No.: 421,789

[22] Filed: Apr. 14, 1995

Related U.S. Application Data

[62] Division of Ser. No. 216,424, Mar. 23, 1994, Pat. No. 5,435,263.

[30] Foreign Application Priority Data

Mar. 29, 1993 [JP] Japan ......................... 5-95617

[51] Int. Cl.⁶ ................................................ C30B 35/00
[52] U.S. Cl. ......................... 117/222; 117/208; 117/217
[58] Field of Search ........................... 117/13, 14, 201, 117/208, 217, 220, 222; 373/139; 392/341; 432/156

[56] References Cited

U.S. PATENT DOCUMENTS

| | | | |
|---|---|---|---|
| 2,904,512 | 9/1959 | Horn | 117/21 |
| 4,752,451 | 6/1988 | Aubert et al. | 117/204 |
| 4,971,652 | 11/1990 | Azad | 117/15 |
| 5,170,061 | 12/1992 | Baba | 250/559.24 |

FOREIGN PATENT DOCUMENTS

| | | |
|---|---|---|
| 34-8242 | 9/1959 | Japan . |
| 61-150862 | 9/1986 | Japan . |
| 61-205691 | 9/1986 | Japan . |
| 61-205692 | 9/1986 | Japan . |
| 61-215285 | 9/1986 | Japan . |
| 62-880 | 1/1987 | Japan . |
| 63-252989 | 10/1988 | Japan . |
| 5-62165 | 3/1993 | Japan . |

*Primary Examiner*—Felisa C. Garrett
*Attorney, Agent, or Firm*—Burns, Doane, Swecker & Mathis, L.L.P.

[57] ABSTRACT

An apparatus for producing a single crystal comprising a heater which is arranged on the outer periphery of a crucible and movable along the axis of growth of a single crystal. The heater is moved along the direction of growth of the single crystal in accordance with the surface position of the molten liquid layer in the crucible. The apparatus for producing a single crystal further comprising means for adjusting the speed at which the seed crystal is pulled. For example, the pulling speed of the seed crystal is adjusted in accordance with the position of the heater.

8 Claims, 8 Drawing Sheets

APPARATUS FOR PRODUCING SINGLE CRYSTAL

This application is a divisional of application Ser. No. 08/216,424, filed Mar. 23, 1994, now U.S. Pat. No. 5,435,263.

BACKGROUND OF THE INVENTION

1. Field of the Invention

The present invention relates to a method of producing a single crystal and an apparatus used therefor.

2. Description of Related Art

There are various methods of growing a single crystal, one of which is a pulling method called Czochralski method (CZ method).

Figure 1:
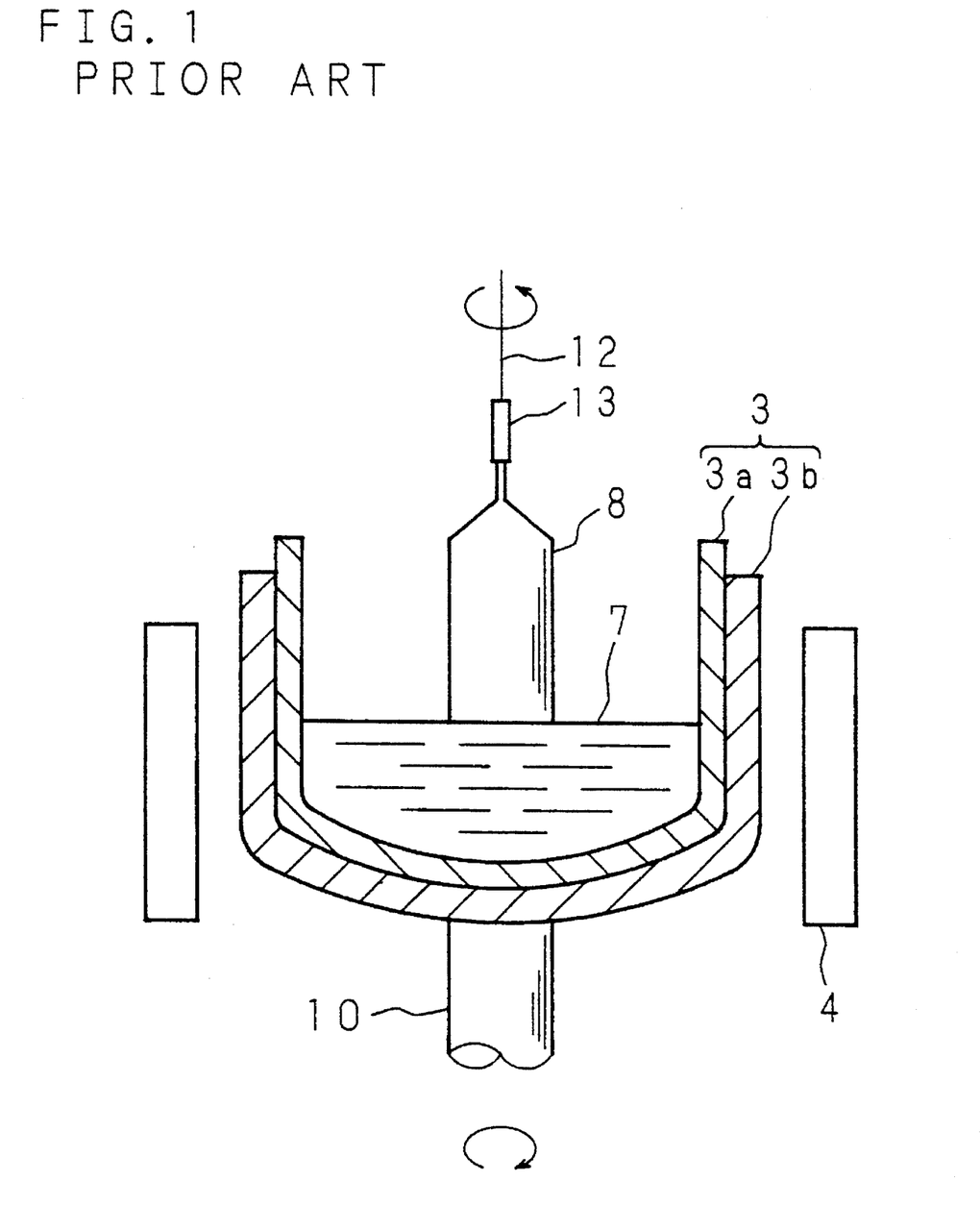
FIG. 1 is a longitudinal sectional view schematically showing a conventional prior art apparatus for producing a single crystal.

FIG. 1 is a longitudinal sectional view schematically showing a conventional apparatus for producing a single crystal used For the CZ method. In FIG. 1, numeral 3 designates a crucible arranged in a chamber. The crucible 3 includes a bottomed cylindrical quartz inner-layer container 3a and a bottomed cylindrical graphite outer-layer container 3b fitted on the outside of the inner-layer container 8a. A heater 4 of resistance heating type is arranged concentrically with the crucible 3 on the outside of the crucible 3. The crucible 3 is Filled with a molten liquid material 7 melted by the heater 4. A lift axis 12 of a lift rod, wire or the like is suspended above the center of the crucible 3. A seed crystal 18 is set at the lower end of the lift axis 12. In growing a single crystal 8, the lift axis 12 is pulled up after the seed crystal 13 is made in contact with the surface of the molten liquid material 7. Then, the molten liquid material 7 attached to the seed crystal 13 solidifies and grows to form a single crystal 8.

According to the CZ method, impurity is often added to the molten liquid material 7 before the pulling process in order to adjust the electrical resistivity and electrical conduction type of the single crystal 8. The problem in this case is the segregation of impurity which may occur along the longitudinal direction of the single crystal 8. This segregation is caused by the Fact that the ratio $C_s/C_L$ in the boundary between the molten liquid material 7 and the single crystal 8, i.e., the effective segregation coefficient $K_e$, is not 1, where $C_s$ is the impurity concentration of the single crystal 8 and $C_L$ the impurity concentration in the molten liquid material 7. Generally, $K_e$ is often less than 1, in which case the impurity concentration in the molten liquid material 7 gradually rises with the growth of the single crystal 8. The natural result of this is that a single crystal 8 having electrical characteristics lacking uniformity along the longitudinal direction is produced.

Figure 2:
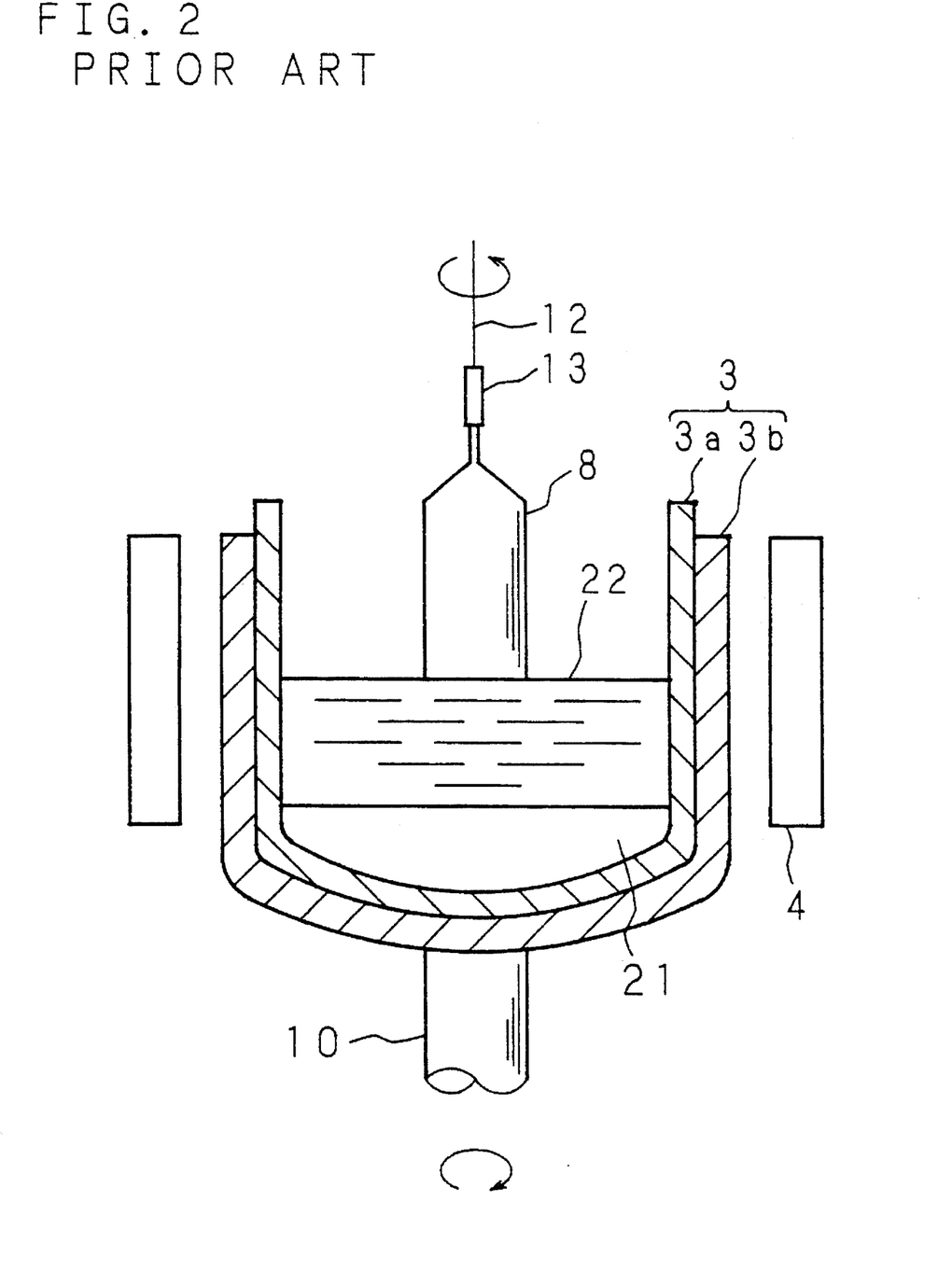
FIG. 2 is a longitudinal sectional view schematically showing the manner in which the prior art Double Layered CZ method is embodied.

The Double Layered CZ method is known as a method of suppressing the segregation. FIG. 2 is a longitudinal sectional view schematically showing an apparatus for producing a single crystal used for implementing the Double Layered CZ method. In the conventional apparatus shown in FIG. 2, the heater 4 is arranged at a position higher than that in the apparatus shown in FIG. 1. According to the Double Layered CZ method, a solid layer 21 of a crystal material is arranged in the lower part of the crucible 3 and a molten liquid layer 22 of the crystal material is formed above the solid layer 21 by subjecting the heater 4 to control in such a manner as to allow the solid layer 21 and the molten liquid layer 22 to coexist. After making the seed crystal 13 in contact with the molten liquid layer 22, a lift axis 12 is pulled up to grow a single crystal 8. According to this method, the solid layer 21 is melted as the single crystal 8 grows, so that the impurity concentration in the molten liquid layer 22 is kept constant to suppress the segregation. This method has another advantage in that it can be implemented in the apparatus used for the CZ method by controlling the partial heating of the heater.

Figure 3:
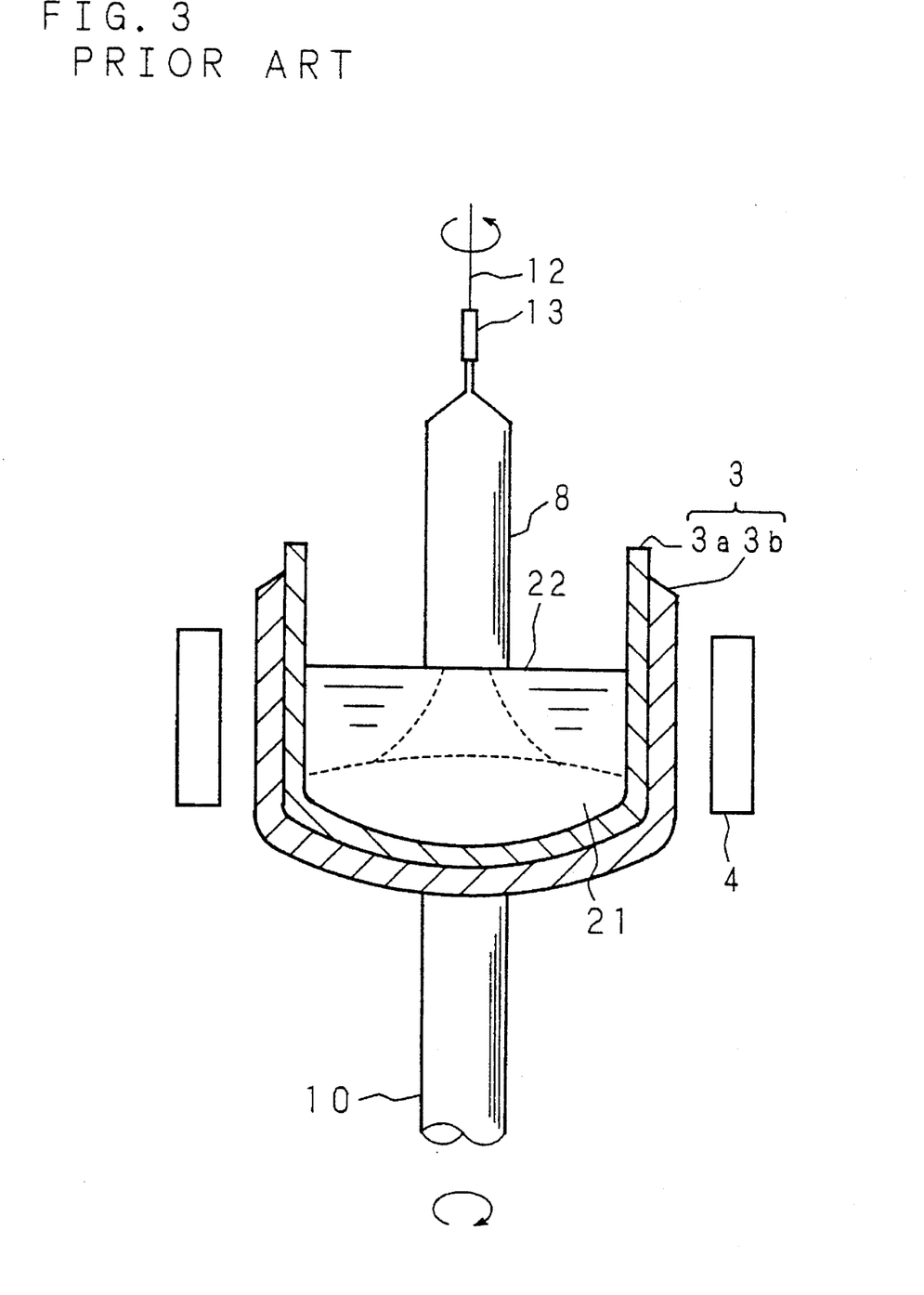
FIG. 3 is a longitudinal sectional view schematically showing the manner in which the contact between the solid layer and the single crystal occurs in the prior art Double Layered CZ method.

In the aforementioned Double Layered CZ method, the central portion of the molten liquid layer 22 in close proximity to the solid layer 21 often solidifies into undesirable contact with the single crystal 8 being pulled up during crystal growth. This condition is shown in FIG. 3 and is very dangerous. The contact, once happened, not only damages the single crystal 8 itself but also, in case of shaft type, breaks the seed crystal and generates the Fall down of the crystal, or in case of wire type, leads to a secondary damage such as a twisted wire and a broken wire.

SUMMARY OF THE INVENTION

The invention has been developed in order to obviate the above-mentioned problems, and the object thereof is to provide a method of producing a single crystal and an apparatus for embodying the method, in which the contact between a solid layer and a single crystal is avoided by maintaining the relation between the single-crystal pulling speed and the heater position relative to the surface of molten liquid layer within a predetermined range.

The contact between the solid layer and the single crystal during the pulling of a single crystal appears to be affected by the temperature of the portion immediately below the crystal-liquid interface. The inventors decided that a factor for determining the temperature immediately below the crystal-liquid interface boundary is the heater position relative to the surface of molten liquid layer and the pulling speed, and determined the correlationship between these parameters.

According to one aspect of the invention, there is provided a method of producing a single crystal, in which the heater position relative to the surface of the molten liquid layer is adjusted by being moved along the direction of pulling the seed crystal in accordance with the seed-crystal pulling speed on the basis of the correlationship determined above.

According to another aspect of the invention, there is provided a method of producing a single crystal, in which the seed-crystal pulling speed is adjusted in accordance with the heater position relative to the surface of the molten liquid layer on the basis of the correlationship determined above.

According to still another aspect of the invention, there is provided an apparatus for producing a single crystal comprising a heater arranged on the outer periphery of the crucible and movable along the direction of pulling the seed crystal.

According to a further aspect of the invention, there is provided an apparatus for producing a single crystal, comprising means for adjusting the pulling speed.

Consequently, it is possible to prevent the temperature drop of the molten liquid layer so as to avoid the contact between the solid layer and the single crystal which otherwise might be caused by the solidification of the central portion of the molten liquid layer. Also, even when the temperature of the molten liquid layer decreases due to variations in tile pulling speed of the single crystal, the contact between the solid layer and the single crystal can be avoided by moving the heater and thus controlling the temperature of the molten liquid layer. Further, in the case where the temperature of the molten liquid layer decreases due to variations in the heater output while the single crystal is being pulled, the contact between the solid layer and the single crystal can be avoided by adjusting the pulling speed and thus controlling the temperature of the molten liquid layer.

The above and further objects and features of the invention will more fully be apparent from the following detailed description with accompanying drawings.

DESCRIPTION OF THE PREFERRED EMBODIMENTS

The invention will be described below with reference to the diagrams showing embodiments thereof.

Figure 4:
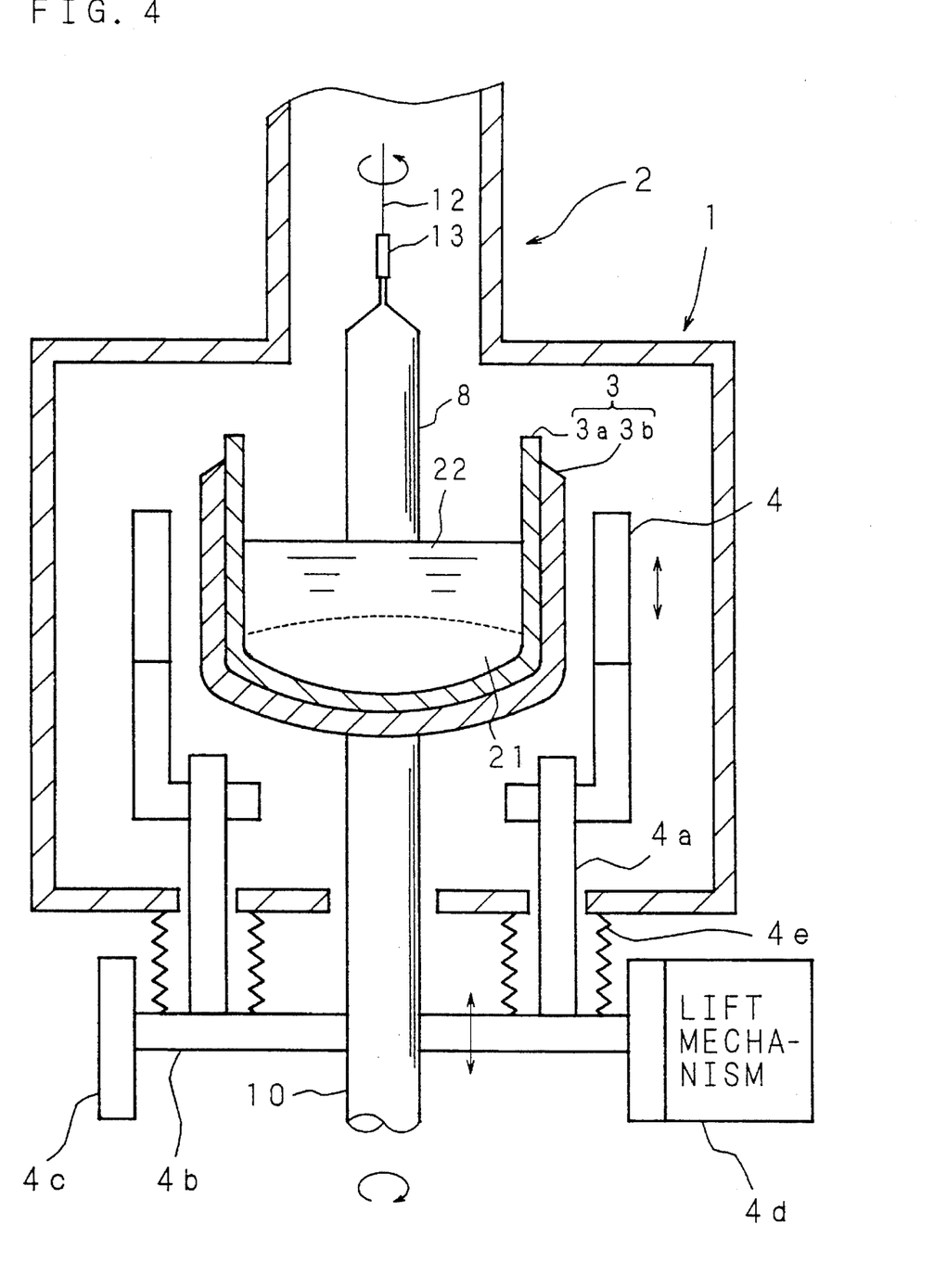
FIG. 4 is a longitudinal sectional view schematically showing an apparatus for producing a single crystal according to the invention.

FIG. 4 is a longitudinal sectional view schematically showing an apparatus for producing a single crystal according to the invention, in which the Double Layered CZ method is embodied. In FIG. 4, numeral 1 designates a chamber comprising a cylindrical vacuum container. A guard cylinder 2 smaller than the chamber 1 is arranged above the chamber 1. A crucible 3 comprising a cylindrical bottomed quartz inner-layer container 3a and a cylindrical bottomed graphite outer-layer container 3b fitted on the outside of the container 8a is arranged at the central portion of the chamber 1. A shaft 10 for rotating and moving up and down the crucible 8 is arranged at the bottom of the outer-layer container 3b of the crucible 8. A lift axis 12 is rotatably and vertically-movably suspended through a guard cylinder 2 above the crucible 8, and a seed crystal 18 is replaceably mounted at the lower end of the lift axis 12.

A heater 4 made of a resistance heating coil or the like is arranged on the outer periphery of the crucible 3. This heater 4 is adapted to move up and down due to the configuration of heater moving mechanism described below. Specifically, an electrode 4a doubling as a shaft for moving the heater 4 up and down is mounted below the heater 4. A plate 4b is fixed at the lower end of the electrode 4a. The periphery of the electrode 4a between the plate 4b and the lower plate of the chamber 1 is surrounded by a bellows 4e. The plate 4b is adapted to move vertically along guides 4c provided on the sides thereof by a lift mechanism 4d.

In the apparatus according to the invention configured as described above, the heater 4 melts the upper part of the material in the crucible 8 to form a molten liquid layer 22 to a predetermined thickness and a solid layer 21 to a predetermined thickness in the lower part thereof. The lower end of the seed crystal 18 is immersed in the molten liquid layer 22, and is rotated while moving up, thereby forming the single crystal 8 at the lower end of the seed crystal 13.

Now, a method according to the invention will be explained.

Figure 5:
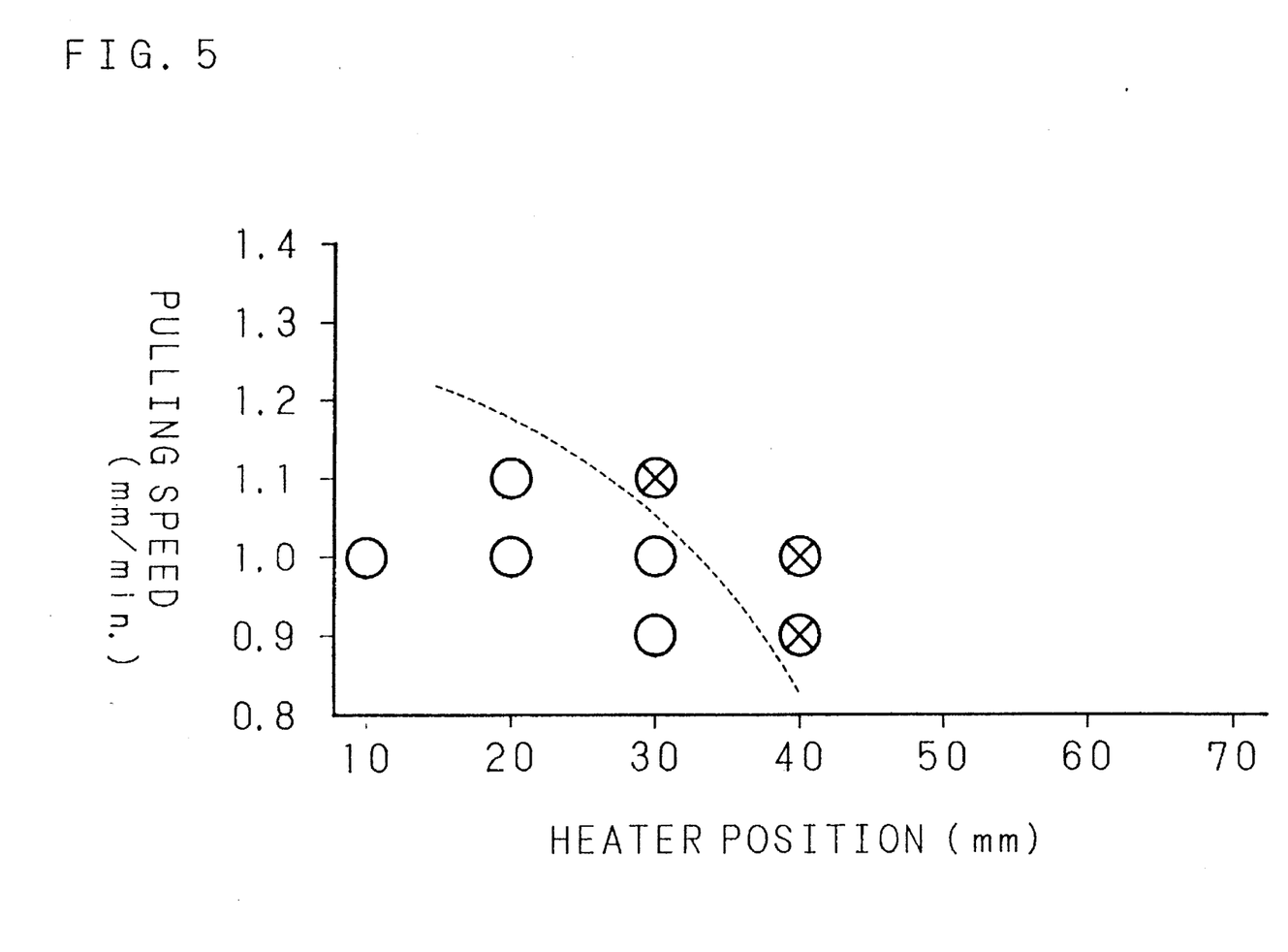
FIG. 5 is a graph showing the presence or absence of contact between the solid layer and the single crystal in a coordinate system representing the heater position versus the pulling speed.
Figure 6:
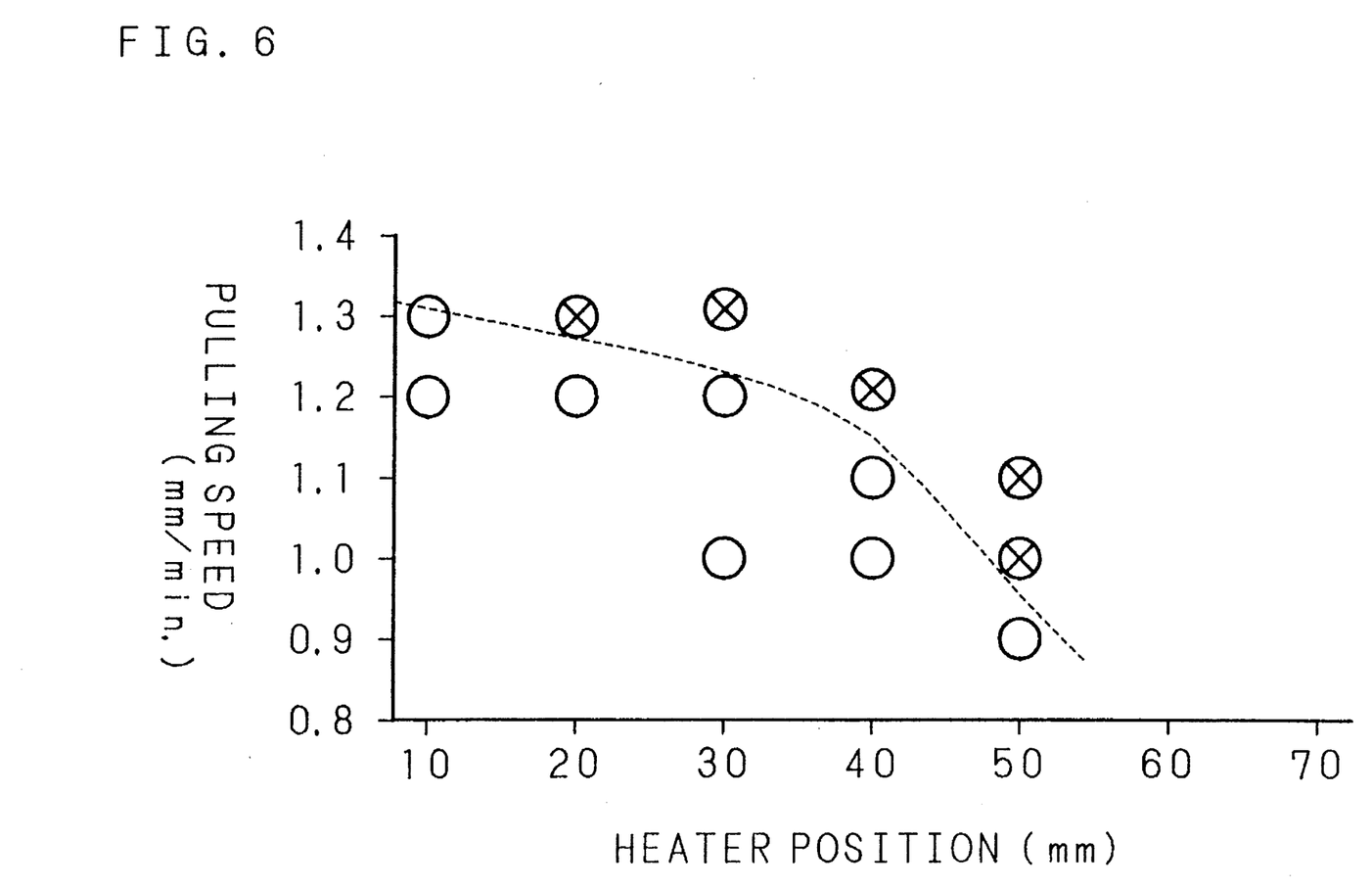
FIG. 6 is a graph showing the presence or absence of contact between the solid layer and the single crystal in a coordinate system representing the heater position versus the pulling speed.
Figure 7:
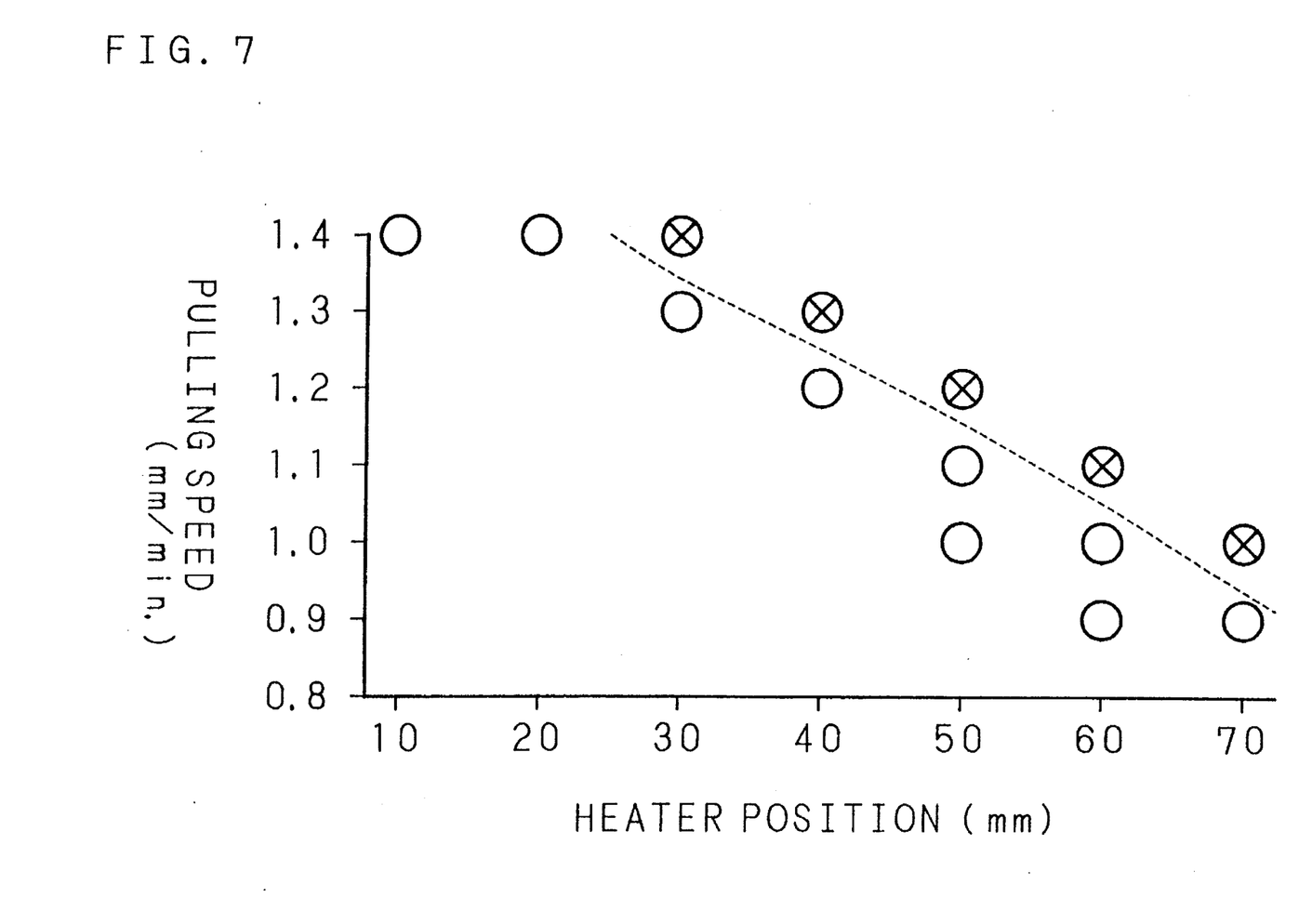
FIG. 7 is a graph showing the presence or absence of contact between the solid layer and the single crystal in a coordinate system representing the heater position versus the pulling speed.

FIGS. 5, 6 and 7 show the result of investigating the presence or absence of contact between the solid layer and the single crystal in different combinations of the pulling speed and the difference of height between the upper end of the heater and the surface of the molten liquid layer 22 (heater position) in apparatuses having different operating conditions including the frequency of operations. The heater 4 has a height of 150 mm, the crucible 3 has a dimension of 16 inches in diameter and 14 inches in height, and the material is 65 kilograms in charge.

The higher the pulling speed and the higher the heater position, the lower the temperature of the molten liquid layer, resulting in an increased possibility of contact between the solid layer and the single crystal. Such a contact, however, did not occur for the combinations specified in the portion below the dashed line in the diagram.

Among the three apparatuses having the correlationship shown in FIGS. 5, 6 and 7, the apparatus having the correlationship shown in FIG. 5 has the narrowest range free of contact between the solid layer and the single crystal with the operability range limited most of all. The apparatus having the correlationship shown in FIG. 6, on the other hand, has a wider operability range. The range is still wider for the apparatus having the correlationship shown in FIG. 7. In this way, the operability range varies from one apparatus to another depending on the conditions such as the frequency of operations. It is therefore necessary to determine the particular correlationship for each apparatus in advance.

A single crystal is produced by determining the heater position and the pulling speed on the basis of the above-mentioned correlationship. In the apparatus having the correlationship shown in FIG. 7, for example, on the assumption that the pulling speed is 1.2 mm/min and the heater position is 40 mm, the solid layer and the single crystal do not come into contact with each other. When the heater position is 50 mm, by contrast, the contact occurs. Even when the heater position is 50 mm, however, it does not always mean that the solid layer and the single crystal come into contact with each other soon. When the heater position is changed from 50 mm to 40 mm at a certain time point during the pulling process, such a contact can be prevented.

In the case where the heater position is fixed at 40 mm, on the other hand, the solid layer and the single crystal do not contact with each other when the pulling speed is 1.2 mm/min. When the pulling speed is 1.3 mm/min, however, such a contact may occur. Also in this case, it does not always mean that the solid layer and the single crystal come into contact with each other soon even when the pulling speed is 1.3 mm/min, and the contact can be prevented by changing the pulling speed from 1.3 mm/min to 1.2 mm/min at a certain time point during the pulling process.

The pulling speed, which affects the thermal history of the single crystal or the like, is in most cases limited according to the type of single crystal. As a result, the solid layer and the single crystal can be prevented from contacting with each other by adjusting the heater position according to the pulling speed.

For the apparatus having the correlationship as shown in FIG. 5, due to its narrow applicability range, the heater position is required to be changed finely each time the pulling speed is changed. The apparatus having the correlationship shown in FIG. 7, however, due to its wide applicability range, requires no fine adjustment of the heater position.

Figure 8:
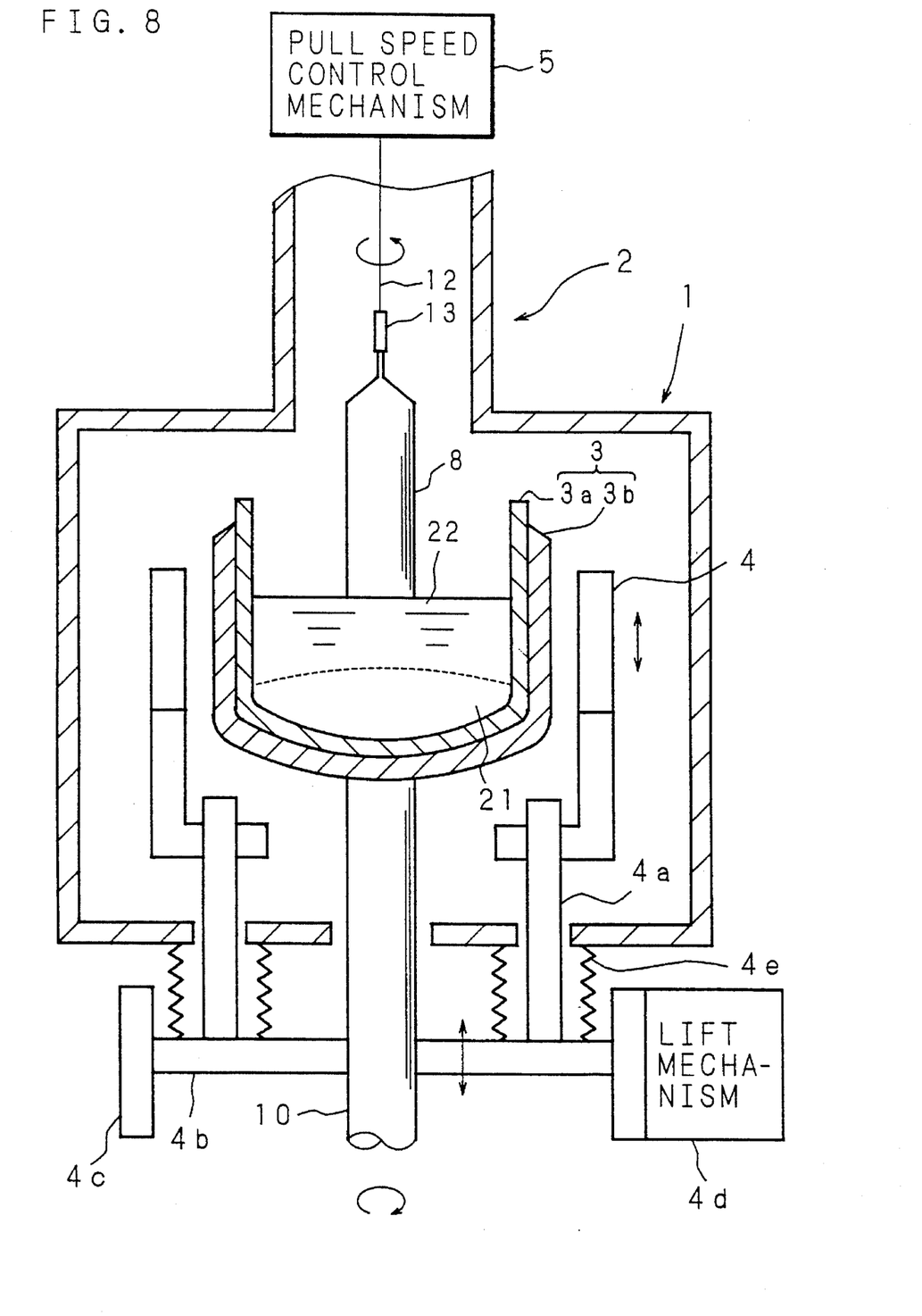
FIG. 8 is a longitudinal sectional view schematically showing another embodiment of an apparatus for producing a single crystal.

FIG. 8 is a longitudinal sectional view schematically showing another embodiment of an apparatus for producing a single crystal. In this embodiment, a pulling speed control mechanism 5 is connected to the lift axis 12. The pulling speed of the seed crystal 13 with the lift axis 12 is controlled by the control mechanism 5. The other configuration is identical with that of FIG. 4. Therefore, corresponding elements are designated by the same reference numerals and their description is omitted.

In this embodiment, the correlationship as shown in FIGS. 5, 6, and 7 is determined in advance. By using the pulling speed control mechanism 5, the pulling speed of the seed crystal 18 is controlled in accordance with the heater position relative to the surface of the molten liquid layer on the basis of the correlationship determined in advance. In this embodiment, as in the preceding embodiment, the contact between the single crystal and the solid layer is avoided.

It will thus be understood from the foregoing description that according to the invention, the heater position relative to the surface of the molten liquid layer is moved and adjusted vertically according to the pulling speed and pulling speed is also regulated according to the heater position. As a consequence, the temperature drop of the molten liquid layer is prevented, and the contact can be avoided which otherwise might occur between the solid layer and the single crystal due to the solidification of the central portion of the molten liquid layer. Further, the interruption of the pulling operation and the fall down of the single crystal due to the contact between the solid layer and the single crystal are prevented.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. An apparatus for producing a single crystal, comprising:
    a crucible for accommodating a material having a liquid layer and a solid layer;
    a seed crystal set in a position facing the crucible;
    means for pulling up a seed crystal; and
    a heater mounted on an outer periphery of said crucible and movable along the direction of pulling up the single crystal, the crucible containing a layer of liquid material above a solid layer of the material, the layer of liquid material being heated by the heater, the heater being positioned to maintain a correlationship between a pulling speed of the seed crystal and heater position such that the solid layer does not contact a single crystal pulled from the layer of liquid material, the heater position being adjusted by moving the heater to position along the pulling direction of the seed crystal at which said correlationship will be maintained during pulling the single crystal from the layer of liquid material.

2. An apparatus for producing a single crystal as claimed in claim 1, further comprising:
    means for adjusting the pulling speed of the seed crystal.

3. The apparatus for producing a single crystal as claimed in claim 2, further comprising a heater moving mechanism for moving the heater and, the heater moving mechanism and the means for adjusting the pulling speed of the seed crystal operating independently of each other.

4. The apparatus for producing a single crystal as claimed in claim 2, wherein the means for adjusting the pulling speed provides a pulling speed which varies with heater location, the means for adjusting the pulling speed adjusting the pulling speed as a function of the heater location such that the pulling speed is higher when the heater is located at a lower position and the pulling speed is lower when the heater is located at a higher position.

5. The apparatus for producing a single crystal as claimed in claim 1, further comprising a crucible lifting mechanism for raising the crucible during pulling of the seed crystal.

6. The apparatus for producing a single crystal as claimed in claim 1, wherein the means for pulling provides a constant pulling speed during pulling of the seed crystal.

7. The apparatus of producing a single crystal as claimed in claim 1, wherein the means for pulling provides a changing pulling speed during pulling of the seed crystal.

8. The apparatus for producing a single crystal as claimed in claim 1, wherein the means for pulling adjusts the seed crystal pulling speed in accordance with the heater position so as to maintain the correlationship.

* * * * *